(12) United States Patent
Hirose

(10) Patent No.: US 7,250,879 B2
(45) Date of Patent: Jul. 31, 2007

(54) DECODER CIRCUIT AND DECODING METHOD

(75) Inventor: Toshiyuki Hirose, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/383,296

(22) Filed: May 15, 2006

(65) Prior Publication Data

US 2006/0267806 A1   Nov. 30, 2006

(30) Foreign Application Priority Data

May 25, 2005   (JP) ............................. 2005-152685

(51) Int. Cl.
*H03M 7/00*   (2006.01)
(52) U.S. Cl. ........................................ 341/106; 341/51
(58) Field of Classification Search .................. 341/51, 341/106, 95, 87; 382/232; 707/2, 3; 715/532
See application file for complete search history.

(56) References Cited

U.S. PATENT DOCUMENTS

| 2002/0176302 A1* | 11/2002 | Jung et al. .................. 365/222 |
| 2003/0202385 A1* | 10/2003 | Shin ........................... 365/194 |
| 2004/0260912 A1* | 12/2004 | Linnermark ................ 712/218 |

* cited by examiner

*Primary Examiner*—Brian Young
(74) *Attorney, Agent, or Firm*—Oblon, Spivak, McClelland, Maier & Neustadt, P.C.

(57) ABSTRACT

A decoder circuit includes a first delay means for delaying unit data read out from a dictionary, a selecting means for selecting data and a second delay means for delaying data selected by the selecting means, wherein delayed data from the second selecting means is written again in the dictionary, the selecting means is supplied with delayed data from the first delay means and delayed data from the second delay means and the selecting means selects delayed data from the second delay means if a read address and a write address of the dictionary fall within a range of a predetermined distance corresponding to delay amounts of the first and second delay means and the selecting means selects delayed data from the first delay means in other cases.

5 Claims, 12 Drawing Sheets

- Example to Decode Code Words (Copy Pointer, Match Count = 4, Match Address = 9)
- wadr : Write Address
- radr : Read Address ■ Read "C" From Address=11 and Write "C" in Address=4 Again

DECODER CIRCUIT AND DECODING METHOD

CROSS REFERENCES TO RELATED APPLICATIONS

The present invention contains subject matter related to Japanese Patent Application JP 2005-152685 filed in the Japanese Patent Office on May 25, 2005, the entire contents of which being incorporated herein by reference.

BACKGROUND OF THE INVENTION

1. Field of the Invention

The present invention relates to a decoder circuit for decoding data compressed by using a LZ 77 method (Lempel-Ziv 77 method), for example, and particularly to a decoder circuit and a decoding method which can make decoding processing become faster.

2. Description of the Related Art

A LZ 77 method exists as a kind of dictionary type data compression algorithms. The LZ77 method is used in data compressing and decoding circuits provided within various kinds of data recording apparatus such as an ALDC (Adaptive Lossless Data Compression) encoder and an ALDC decoder within an AIT format tape drive, an S-AIT format tape drive or an LTO format tape drive.

A data compression principle of the LZ77 method will be described. That is, a last character string of a predetermined size of character strings (data strings) that have been inputted in the past is registered in a dictionary (history buffer), a match character string of a newly inputted character string (that is, a character string to be compressed) is retrieved from the dictionary and the newly inputted character string is replaced with address information of the match character string. This dictionary is not a static type dictionary but it is updated so as to remove an old character string by adding the character string just before the character string to be compressed in accordance with a progress of data compression. Hence, this dictionary is called a "sliding dictionary".

FIG. 1 of the accompanying drawings is a schematic diagram showing an example of the manner in which data is compressed by the above-mentioned LZ77 method. Although it has been customary that the ordinary dictionary is 512 bytes, 1024 bytes or 2048 bytes in size, this sliding type dictionary is 16 bytes in size for simplicity of explanation. As shown in FIG. 1, a last character string "ABC-CAB . . . BCC" (each of the characters A, B and C is one byte) of 16 characters of character strings that had been inputted in the past is registered as a dictionary. The character "A" that was inputted 16 bytes before is assigned an address 0, the character "B" that was inputted 15 bytes before is assigned an address 1 and the character "C" that was inputted one byte before is assigned an address 15.

When the newly inputted character string is "ABCA", for example, a character string of addresses 9 to 12 is matched with "ABCA" by the retrieval processing. Accordingly, in this case, the address 12 is outputted as a match address (address defined as the end address of the match character string). Then, in the end, the character string "ABCA" of 4 bytes is compressed to 2 bytes by transforming the character string "ABCA" into a code word (Copy Pointer, Match Count=4 and Match Address=9) indicating a match address length 4 and a leading address 9.

When the thus compressed data is decoded, referring to this dictionary in the opposite manner, the code word (Copy Pointer, Match Count=4 and Match address=9) is transformed into the character string "ABCA". In that case, as the processing opposite to the processing in which the dictionary is updated when data is compressed, the dictionary used upon compressing may be restored by rewriting characters in the dictionary in accordance with a progress of decoding processing.

FIGS. 2 to 6 are respectively schematic diagrams showing the manner in which compressed data are decoded, from a standpoint of elapse of time, in association with the dictionary shown in FIG. 1. First, as shown in FIG. 2, a dictionary address 9 (Match Address=9 indicated by a code word) is designated as a read address radr and a dictionary address 2 is designated as a write address wadr. Then, as shown in FIG. 3, a character "A" is read out from the address 9 and this character "A" is written again in the address 2, whereafter addresses 10 and 3 are designated as the read address radr and the write address wadr, respectively.

Subsequently, as shown in FIG. 4, a character "B" is read out from the address 10 and this character "B" is written again in the address "3", whereafter addresses 11 and 4 are designated as the read address radr and the write address wadr, respectively.

Subsequently, as shown in FIG. 5, a character "C" is read out from the address 11 and this character "C" is written again in the address 4, whereafter addresses 12 and 5 are designated as the read address radr and the write address wadr, respectively.

Subsequently, as shown in FIG. 6, a character "A" is read out from the address 12 and this character "A" is written again in the address 5, whereafter addresses 13 and 6 are designated as the read address radr and the write address wadr, respectively.

As described above, based on the code words (Copy Pointer, Match Count=4 and Match Address=9), data is read out from the dictionary character by character (unit data) and thus read character is written again in other address of the dictionary, whereafter the next one character is read out and thereby the character string "ABCA" is decoded.

According to the related art, in the decoder circuit for decoding data compressed by using this LZ77 method, the read unit data is written again in the dictionary at one period of operation clock.

[Cited Patent Reference 1]: Republished Patent Application of International Publication Number WO2003/032296 (pp. 12 to 13, FIGS. 3 and 4)

SUMMARY OF THE INVENTION

However, this related-art decoder circuit is unsuitable for making decode processing become faster due to the following reasons. That is, when a decoder circuit is designed on an ASIC (application specific integrated circuit) using a 0.11 μm CMOS (complementary metal-oxide semiconductor), for example, and a dictionary is stored in a SRAM (static random-access memory), if the dictionary is large in size such as 512 bytes, 1024 bytes or 2048 bytes, it takes a time of approximately 2 nanoseconds to read data from the SRAM and to write data again in the SRAM. This operation of the SRAM is low in speed as compared with a flip-flop circuit, for example, which can be operated at approximately 0.3 nanoseconds.

Further, since it is unavoidable that the SRAM which stores therein a large-size dictionary is increased in area to share an LSI (large-scale integrated circuit), it becomes difficult to locate the SRAM near a controller. As a result, an interconnection between it and the controller is unavoidably extended in length, which leads to the decrease of an operation speed of the SRAM.

Since the SRAM is operated at a low speed as described above, if data read out from the dictionary is written again in the dictionary at one clock period, then it is necessary to extend the clock period and hence the related-art decoding circuit is unsuitable for increasing its speed.

In view of the aforesaid aspects, the present invention intends to provide a decoding circuit which can realize faster decoding processing in a decoder circuit in which data is read out from a dictionary stored in a memory at every predetermined unit data and the thus read unit data is written again in other address of the dictionary, whereafter data can be decoded by reading the next unit data.

Also, the present invention intends to provide a decoding method which can realize faster decoding processing.

According to an aspect of the present invention, there is provided a decoder circuit in which predetermined unit data is read out from a dictionary stored in a memory, the read unit data is written again in a different address of the dictionary and the next unit data is read out from the dictionary to thereby decode data. This decoder circuit is comprised of a first delay means for delaying the unit data read out from the dictionary, a selecting means for selecting data and a second delay means for delaying data selected by the selecting means, wherein delayed data from the second delay means is written again in the dictionary, the selecting means is supplied with delayed data from the first delay means and delayed data from the second delay means, the selecting means selects delayed data from the second delay means if a write address and a read address of the dictionary fall within a range of a distance corresponding to delay amounts of the first and second delay means and the selecting means selects delayed data from the first delay means in other cases.

In this decoder circuit, the unit data read out from the dictionary is delayed by the first delay means and supplied to the selecting means. Also, the data selected by this selecting means is delayed by the second delay means and written again in the dictionary. Also, this data delayed by the second delay means is supplied to the selecting means.

Since timing at which the data read out from the dictionary is written again in the dictionary is delayed delay amounts of the first and second delay means, if the address near the write address of the dictionary is designated as the read address, there is then a possibility that data of the read address will be rewritten (previously-read data will be written again in that read address) before the read data is written again in the read address after the unit data was read out from the read address.

Then, when data is rewritten as described above, unless not the data read out from the read address but the new data to be rewritten is written again in the read address, then it is not possible to restore the dictionary accurately.

Accordingly, the selecting means selects the delayed data from the second delay means if the write address and the read address of the dictionary fall within a predetermined distance corresponding to the delay amounts of the first and second delay means (if the address near the write address is designated as the read address and there is a possibility that the data of the read address will be rewritten). As a result, the data read out from the dictionary is substituted with the delayed data from the second delay means and written again in the dictionary.

The delayed data from the second delay means is data previously read out from the dictionary, that is, data written again in the read address (that is, new data to be rewritten).

Consequently, the new data to be rewritten is written again in the read address and hence the dictionary can be restored with accuracy.

On the other hand, in other cases, the selecting means selects the delayed data from the first delay means. As a consequence, the data read out from the dictionary is simply delayed by the first and second delay means and written again in the dictionary.

As described above, according to this decoder circuit, even when the data read out from the dictionary is delayed and written again in the dictionary and the address near the write address is designated as the read address, it is possible to accurately restore the dictionary.

Then, since the data read out from the dictionary is delayed by the first delay means and supplied to the selecting means, even when the memory that stores therein the dictionary is operated at a low speed, it is possible for the first delay means to obtain a timing margin. As a result, since data can be supplied to the selecting means at a high speed, the selecting means is able to output data at a high speed. Thus, it is possible to realize faster decoding processing based on pipeline processing.

According to another aspect of the present invention, there is provided a decoding method in which predetermined unit data is read out from a dictionary stored in a memory, the read unit data is written again in a different address of the dictionary and the next unit data is read out from the dictionary to thereby decode data. This decoding method is comprised of the steps of a first step for delaying the unit data read out from the dictionary, a second step for selecting data and a third step for delaying data selected by the second step and writing delayed data again in the dictionary, wherein the second step is supplied with delayed data from the first step and delayed data from the third step and selects delayed data from the third step if a write address and a read address of the dictionary fall within a range of a distance corresponding to delay amounts of the first and third steps and the second step selects delayed data from the first step in other cases.

According to this decoding method, in exactly the same manner as that has been described so far in the decoding circuit according to the present invention, even when the address near the write address is designated as the read address, while the dictionary can be restored accurately, it is possible to realize faster decoding processing based on pipeline processing.

According to the present invention, in the decoder circuit in which data is read out from a dictionary stored in a memory at every predetermined unit data and the thus read unit data is written again in other address of the dictionary, whereafter data can be decoded by reading the next unit data, even when the address near the write address is designated as the read address, while the dictionary can be restored accurately, it is possible to realize faster decoding processing based on pipeline processing.

DESCRIPTION OF THE PREFERRED EMBODIMENTS

Examples in which the present invention is applied to a decoder circuit for decoding data compressed by using a LZ77 method will be described concretely below with reference to the drawings.

First, let us describe an algorithm by which data read out from a dictionary is substituted with data from a flip-flop circuit when which characters read out from the dictionary are delayed two periods of an operation clock by a flip-flop circuit and when an address near a write address is designated as a read address.

Figure 7:
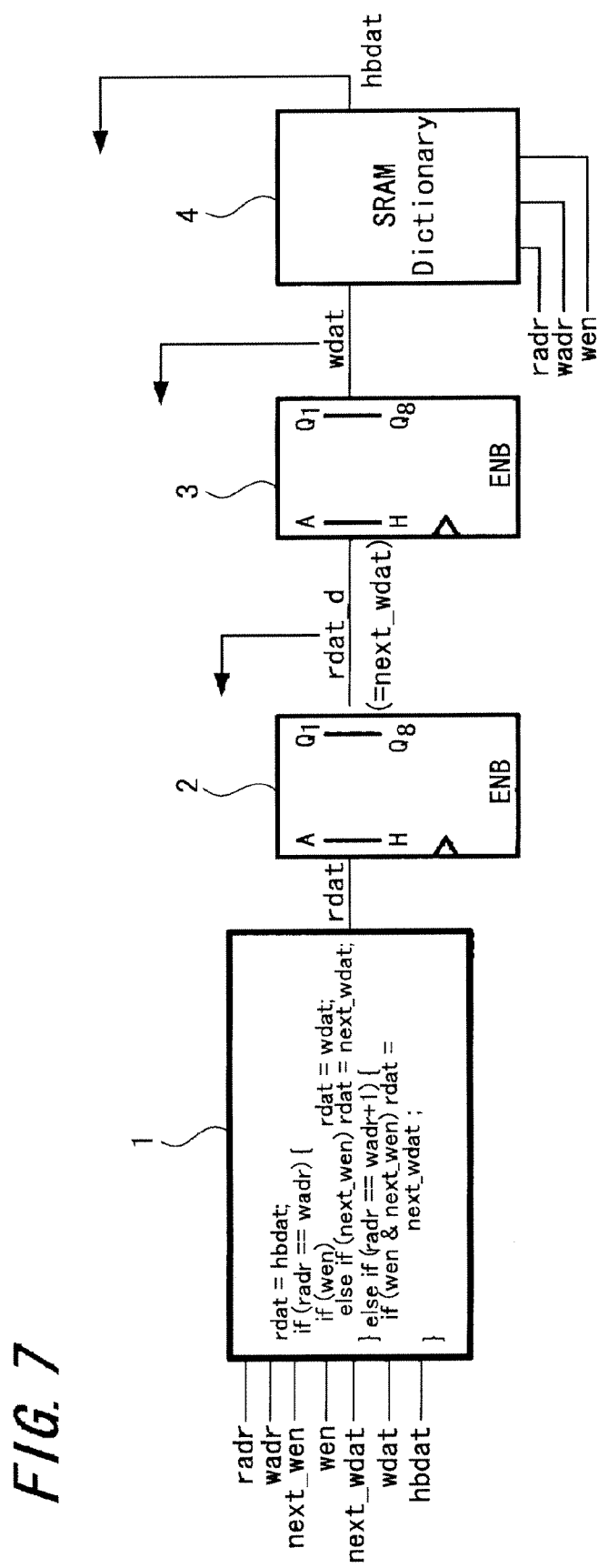
FIG. 7 is a block diagram showing an arrangement of a decoder circuit in which data read out from the dictionary is substituted with data from a flip-flop circuit and which shows a combinational logic circuit 1 shown in FIG. 8 by using a hardware description language.

FIG. 7 is a block diagram showing an arrangement of a decoder circuit using the above-mentioned algorithm.

As shown in FIG. 7, this decoder circuit includes a combinational logic circuit 1 and 8-bit registers 2 and 3. Each of the 8-bit registers 2 and 3 is composed of eight D flip-flop circuits which are located parallelly.

Figure 1:
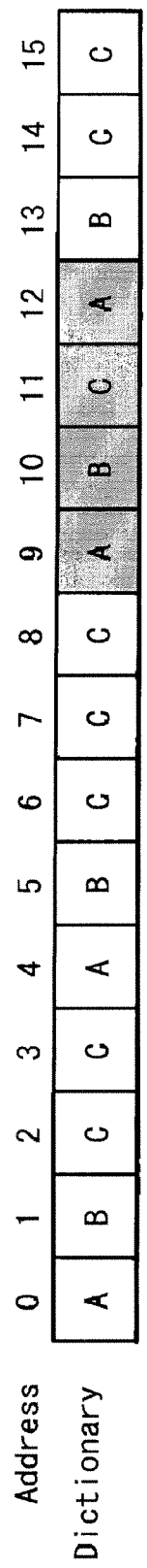
FIG. 1 is a schematic diagram showing an example of the manner in which a character string is compressed by using a dictionary.
Figure 2:
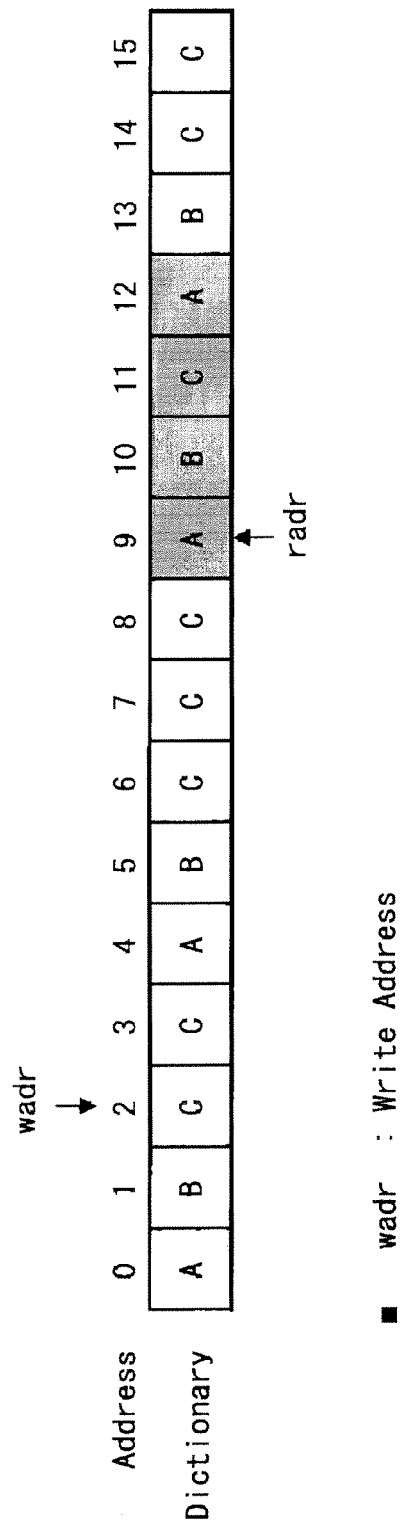
FIG. 2 is a schematic diagram showing an example of the manner in which a character string is decoded by using the dictionary.
Figure 3:
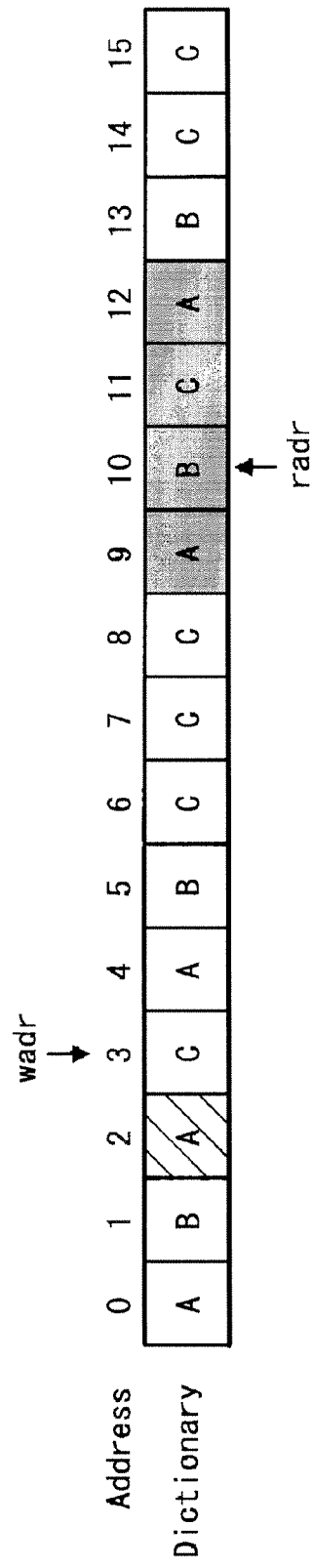
FIG. 3 is a schematic diagram showing an example of the manner in which a character string is decoded by using the dictionary.
Figure 4:
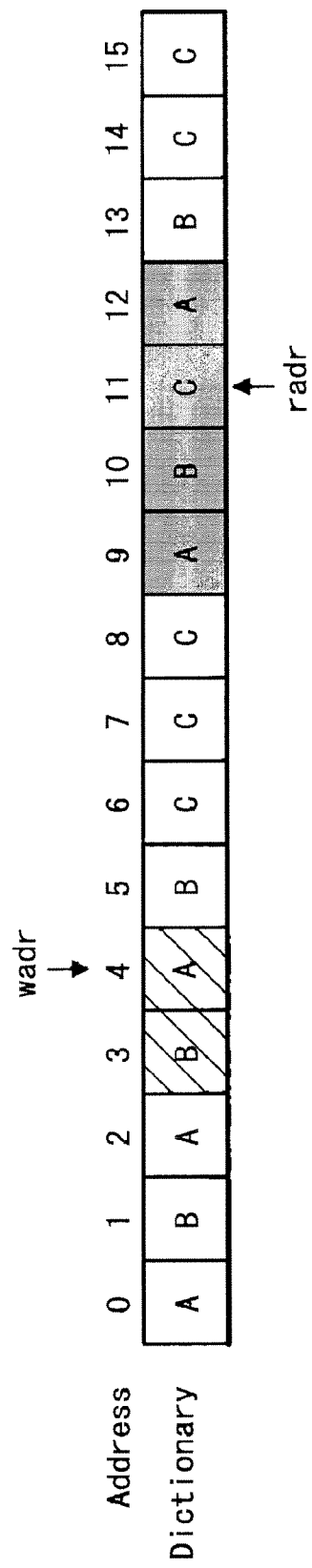
FIG. 4 is a schematic diagram showing an example of the manner in which a character string is decoded by using the dictionary.
Figure 5:
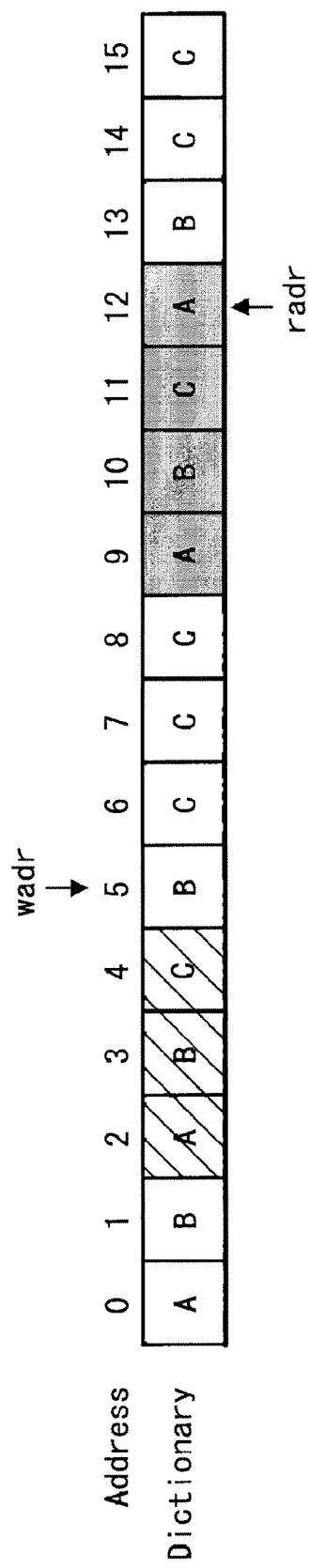
FIG. 5 is a schematic diagram showing an example of the manner in which a character string is decoded by using the dictionary.
Figure 6:
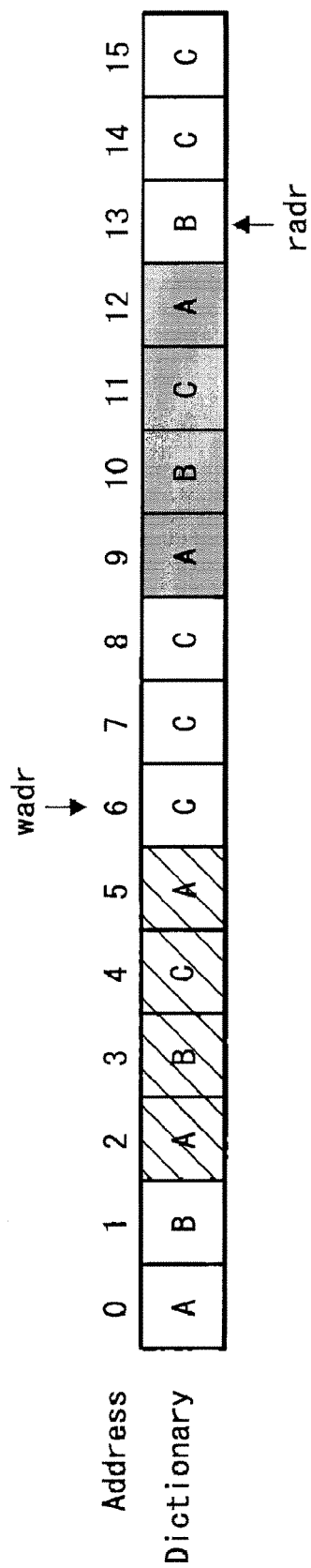
FIG. 6 is a schematic diagram showing an example of the manner in which a character string is decoded by using the dictionary.

A SRAM (static random-access memory) 4 stores therein the dictionary (history buffer) illustrated in FIG. 2. The SRAM 4 is supplied with a read address radr, a write address wadr and a write enable signal wen with respect to a current clock period from a controller (not shown).

In this dictionary, at the clock period in which the write enable signal wen goes to "1", the characters (one byte data) illustrated in FIG. 2 are read out from the read address radr. This data hbdat read out from the dictionary is supplied to the combinational logic circuit 1.

An output next_wdat from the 8-bit register 2 and an output wdat from the 8-bit register 3, both of which will be described later on, are also supplied to the combinational logic circuit 1.

Also, the read address radr, the write address wadr, the write enable signal wen and the write enable signal next_wen concerning the next clock period are supplied from the aforementioned controller to this combinational logic circuit 1.

The combinational logic circuit 1 is an output circuit that selects and outputs any one of the data hbdat read out from the dictionary, the output next_wdat from the 8-bit register 2 and the output wdat from the 8-bit register 3 as the data rdat read out from the dictionary based on the contents of the read address radr, the write address wadr and the write enable signals next_wen and wen.

Figure 8:
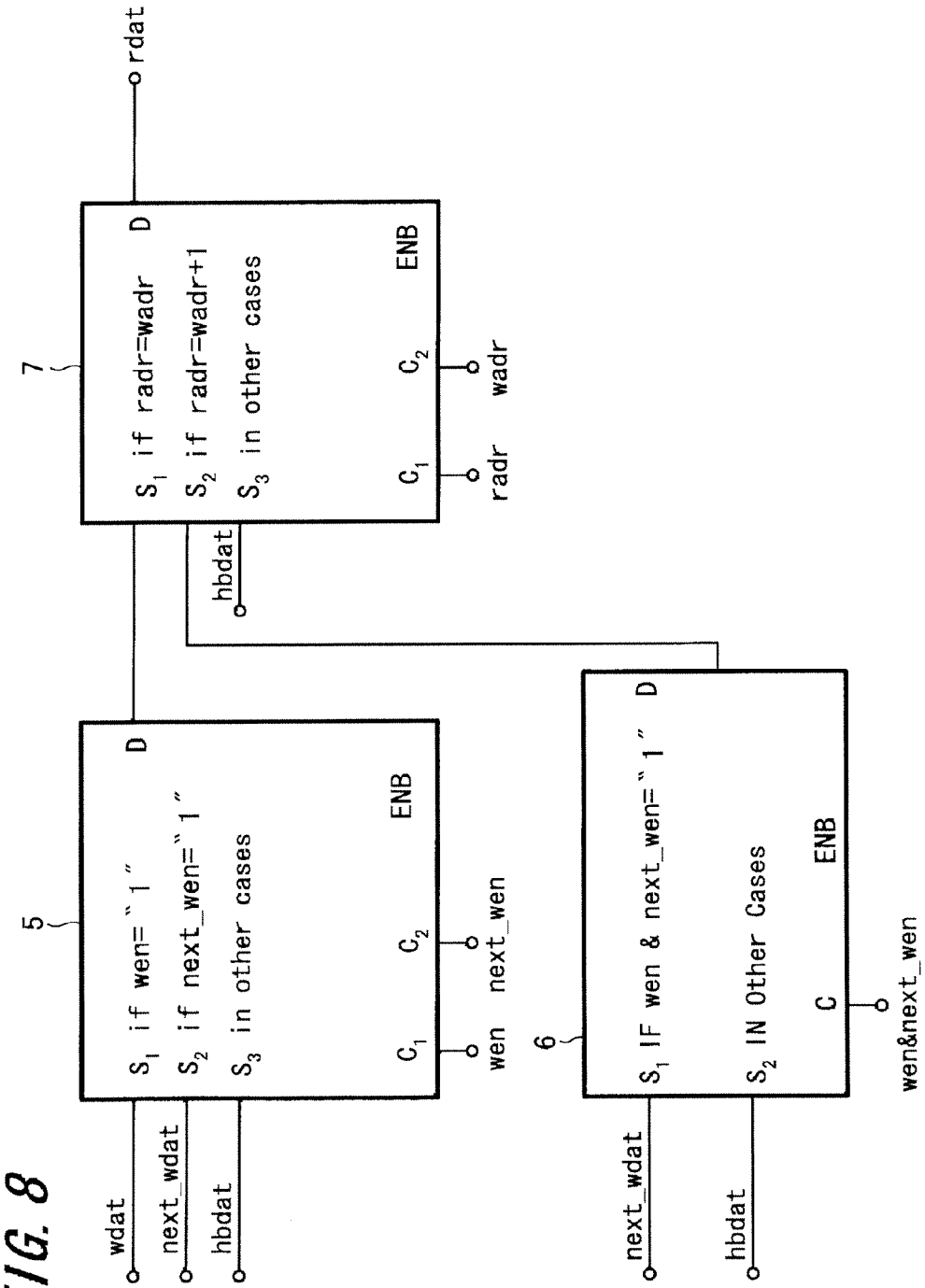
FIG. 8 is a block diagram showing a hardware arrangement of the combinational logic circuit 1 shown in FIG. 7.

FIG. 8 is a block diagram showing the arrangement of this combinational logic circuit 1 in the form of the hardware circuit. As shown in FIG. 8, this hardware circuit of the combinational logic circuit 1 includes a three-input and one-output multiplexer 5, a two-input and one-output multiplexer 6 and a three-input and one-output multiplexer 7.

The data wdat, next_wdat and hbdat are respectively supplied to input terminals S1, S2 and S3 of the multiplexer 5. The write enable signals wen and next_wen are supplied to selection control terminals C1 and C2 of the multiplexer 5.

The multiplexer 5 selects the data wdat supplied to the input terminal S1 and outputs the selected data wdat from its output terminal D if the write enable signal wen is "1" (wen="1"). The multiplexer 5 selects the data next_wdat supplied to the input terminals S2 and outputs the selected output next_wdat from the output terminal D if the write enable signal wen is "0" (wen="0") but the write enable signal next_wen is "1" (next_wen="1"). The multiplexer 5 selects the data hbdat supplied to the input terminal S3 and outputs the selected data hbdat from the output terminal D in other cases.

Data next_wdat and hbdat are respectively supplied to the input terminals S1 and S2 of the multiplexer 6. A signal indicative of a logical product of the write enable signals wen and next_wen is supplied to a selection control terminal C of the multiplexer 6 from an AND circuit (not shown).

If the logical product of the write enable signals wen and next_wen is "1" (if writing of data is permitted in both of the current clock period and the next clock period), the multiplexer 6 selects the data next_wdat supplied to the input terminal S1 and outputs the selected data next_wdat from the output terminal D. In other cases, the multiplexer 6 selects the data hbdat supplied to the input terminal S2 and outputs the selected data hbdat from the output terminal D.

The output from the multiplexer 5, the output from the multiplexer 6 and the data hbdat are respectively supplied to the input terminals S1, S2 and S3 of the multiplexer 7. The data radr and wadr are respectively supplied to the selection control terminals C1 and C2 of the multiplexer 7.

If the data radr and wadr are matched with each other, then the multiplexer 7 selects the output supplied to the input terminal S1 from the multiplexer 5 and outputs the selected output from the output terminal D as the data rdat. If the read address radr and an write address wadr+1 (next address of the write address) are matched with each other, then the multiplexer 7 selects the output supplied to the input terminal S2 from the multiplexer 6 and outputs the selected output from the output terminal D as the data rdat. In other cases, the multiplexer 7 selects the data hbdat supplied to the input terminal S3 and outputs the selected data from the output terminal D as the data rdat.

Logic required when this combinational logic circuit 1 is designed as the ASIC (application specific integrated circuit) and the programmable logic device (that is, FPGA (field programmable gate array), etc.) is described within the block of the combinational logic circuit 1 shown in FIG. 7 by using a Veriolog HDL (hardware description language) which is a kind of hardware description languages.

As shown in FIG. 7, the data rdat outputted from the combinational logic circuit 1 is supplied to the 8-bit register 2. Data rdat_d (data next_wdat which is written again in the dictionary during the next clock period) which results from delaying this data rdat one clock period is outputted from the 8-bit register 2. This data next_wdat is supplied to the 8-bit register 3 and the combinational logic circuit 1 as mentioned hereinbefore.

Data wdat (data which is written again in the dictionary during the current clock period) which results from delaying this data next_wdat one clock period is outputted from the 8-bit register 3. This data wdat is supplied to the SRAM 4 and the combinational logic circuit 1 as mentioned hereinbefore.

In the dictionary within the SRAM 4, this data wdat is written in the address designated as the write address wadr at the clock period in which the write enable signal wen goes to "1".

Figure 9:
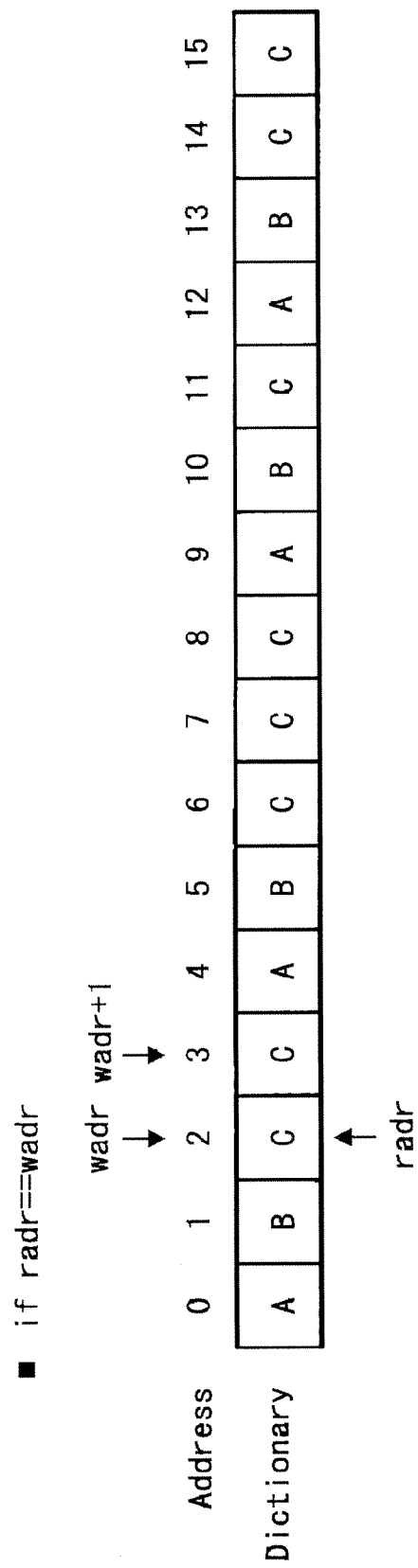
FIG. 9 is a schematic diagram showing the case in which data read out from the dictionary is substituted with data from a flip-flop circuit and written again in the dictionary in the decoder circuit sown in FIG. 7.
Figure 10:
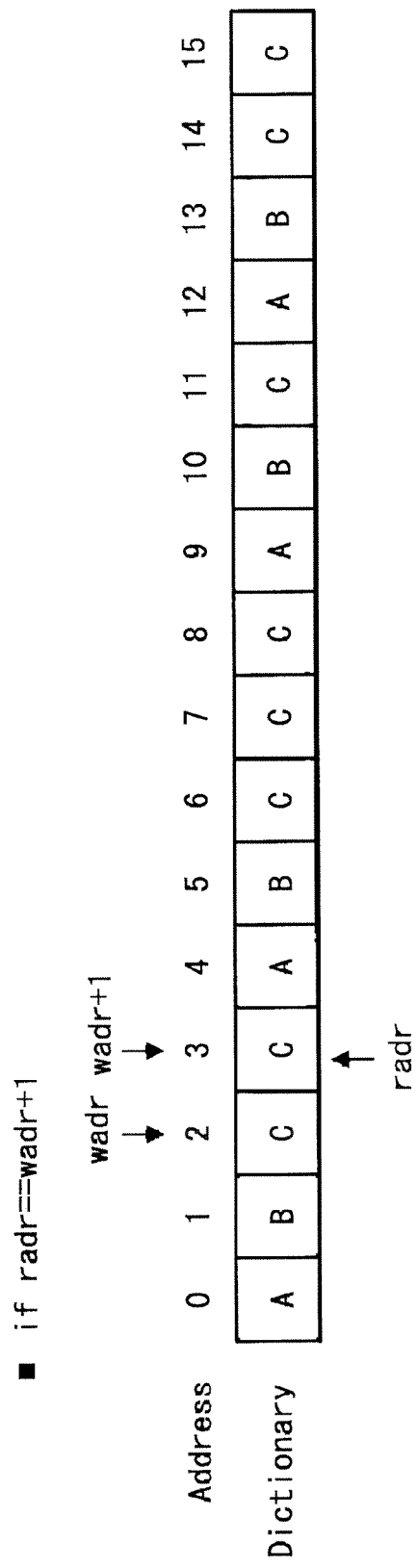
FIG. 10 is a schematic diagram showing the case in which data read out from the dictionary is substituted with data from a flip-flop circuit and written again in the dictionary in the decoder circuit shown in FIG. 7.

FIGS. 9 and 10 are schematic diagrams showing the cases in which data read out from the dictionary is substituted with delayed data from the D flip-flop circuit (8-bit register 2 or 3) and written again in the dictionary in the decoder circuit shown in FIG. 7.

If the same address as the write address is designated as the read address radr or if the next address of the write address wadr is designated as the read address radr because timing at which data read out from the dictionary is written again in the dictionary is delayed two clock periods that are the delay amounts of the 8-bit registers 2 and 3, then there is a possibility that a character at the read address will be rewritten (that is, previously-read character will be written again in that read address) before the read character is written again in the read address after the character was read out from the read address.

When data is rewritten as described above, if not the character read out from the read address but a new character to be rewritten is written again in the read address, then it is not possible to accurately restore the dictionary.

FIG. 9 shows the case in which the same address as the write address wadr is designated as the read address radr. In the case of this example, there is a possibility that a character of the address 2 will be rewritten before a character "C" is written again in the dictionary after the character "C", was read out from the address 2 designated as the read address radr (that is, the previously-read character "A" of the address 0 or the character "B" of the previously-read address 1 will be written again in the address 2).

More specifically, if the write enable signal wen concerning the current clock period is "1", then the character "A", which was read out from the address 0 two clock periods before, is written again in the address 2 so that the character at the address 2 is rewritten to the character "A". Accordingly, in this case, unless not the character "C" read out from the address 2 but the new character "A" to be rewritten is written again in the address 2, then it is not possible to accurately restore the dictionary.

Then, in this case, in the combinational logic circuit 1 shown in FIG. 7, since the read address radr and the write address wadr are matched with each other and the equality of the write enable signal wen is "1" (wen="1") is satisfied, the output wdat of the 8-bit register 3 is selected and outputted as the output rdat (in the block diagram shown in FIG. 8, since the equality of the write enable signal wen is "1" (wen="1") is satisfied, the output wdat is selected by the multiplexer 5 and supplied to the multiplexer 7. Also, since the read address radr and the write address wadr are matched with each other, the output wdat is selected by the multiplexer 7 and outputted as the output rdat. As a consequence, the data hbdat read out from the dictionary is substituted with the output wdat of the 8-bit register 3 and then the output wdat is written again in the dictionary.

The output wdat from the 8-bit register 4 is the character "A" read out from the address 0 of the dictionary shown in FIG. 9 two clock periods before, accordingly, it is data (new character to be rewritten) that is written again in the address 2. Therefore, since the new character "A" to be rewritten is written again in the dictionary, it is possible to accurately restore the dictionary.

Also, in the example shown in FIG. 9, although the write enable signal wen is "0" (wen="0"), if the write enable signal next_wen concerning the next clock period is "1", then a character "B", which was read out from the address 1 one clock period before, is written again in the address 2 with the result that the character of the address 2 is rewritten to "B". Accordingly, in this case, unless not the character "C" read out from the address 2 but the new character "B" to be rewritten is written again in the dictionary, then it is not possible to accurately restore the dictionary.

Then, in this case, in the combinational logic circuit 1 shown in FIG. 7, since the read address radr and the write address wadr+1 are matched with each other and the equality of next_wen="1" (next_wen="1") is satisfied, the output next_wdat of the 8-bit register 2 is selected and outputted as the output rdat (in the block diagram shown in FIG. 8, since the equality of next_wen="1" is satisfied, the output next_wdat is selected by the multiplexer 5 and supplied to the multiplexer 7. Also, since the read address radr and the write address wadr are matched with each other, the output next_wdat is selected by the multiplexer 7 and outputted as the output rdat). As a consequence, the data hbdat read out from the dictionary is substituted with the output next_wdat of the 8-bit register 2 and written again in the dictionary.

The output next_wdat from the 8-bit register 2 is the character "B" which was read out from the address 1 of the dictionary shown in FIG. 9 one clock period before, accordingly, it is the data written again in the address 2 (new character to be rewritten). Thus, since the new character "B" to be rewritten is written again in the dictionary, it is possible to accurately restore the dictionary.

On the other hand, FIG. 10 shows the case in which the next address of the write address wadr is designated as the read address radr. In the case of this example, there is a possibility that a character of the address 3 will be rewritten before a character "C" is written again in the dictionary after the character "C" was read out from the address 3 designated by the read address radr (a character "C" previously read out from the address 2 will be written again in the address 3).

That is, if the write enable signal wen concerning the current clock period is "1" and the write enable signal next_wen concerning the next clock period is "1", then the character "B" read out from the address 1 two clock periods before is written again in the address 2 and the character "C" read out from the address 2 one clock period before is written again in the address 3. In the case of this example, although the characters of the addresses 2 and 3 are identical to each other unexpectedly so that the character of the address 3 is not rewritten, in most cases, the character of the address 3 is rewritten to a different character. Therefore, unless the new character to be rewritten is written again in the address 3, then it is not possible to restore the dictionary accurately.

Then, in this case, in the combinational logic circuit 1 shown in FIG. 7, since the read address radr and the write address wadr+1 are matched with each other and the logical product of the write enable signals wen and next_wen is "1", the output next_wdat of the multiplexer 2 is selected and outputted as the output rdat. In the block diagram shown in FIG. 8, since the logical product of the write enable signals wen and next_wen is "1", the output next_wdat is selected by the multiplexer 6 and supplied to the multiplexer 7. Also, since the read address radr and the write address wadr+1 are matched with each other, the output next_wdat is selected by the multiplexer 7 and outputted as the data rdat. As a consequence, the data hbdat read out from the dictionary is substituted with the output next_wdat of the 8-bit register 2 and it is written again in the dictionary.

The output next_wdat from the 8-bit register 2 is the character that was read out from the address 2 of the dictionary shown in FIG. 10 one clock period before, accordingly, it is the character to be written again in the address 3 (in most cases, the addresses 2 and 3 have different characters and hence the above-mentioned character is the new character to be rewritten). Thus, the new character to be rewritten is written again in the address 3 and therefore the dictionary can be restored accurately.

In other case than the three cases that have been described so far with reference to FIGS. 9 and 10, in the combinational logic circuit 1 shown in FIG. 7, the data hbdat read out from the dictionary is selected and outputted as the data rdat. In the block diagram shown in FIG. 8, the data hbdat is selected by the multiplexer 7 and outputted as the data rdat. As a result, the data hbdat read out from the dictionary is delayed two clock periods by the 8-bit registers 2 and 3 and the delayed data hbdat is written again in the dictionary.

As described above, according to the decoder circuit shown in FIG. 7, even when the data read out from the dictionary is delayed two clock periods and written again in the dictionary and the address near the write address wadr is designated as the read address radr, it is possible to accurately restore the dictionary.

However, in the decoder circuit shown in FIG. 7, since the operation of the SRAM 4 is low in speed as compared with the D flip-flop circuits (8-bit registers 2 and 3), it is not possible to supply the data hbdat from the SRAM 4 to the combinational logic circuit 1 at a high speed. Consequently, since the combinational logic circuit 1 is unable to output the data rdat at a high speed, it is difficult to realize faster decoding processing.

Figure 11:
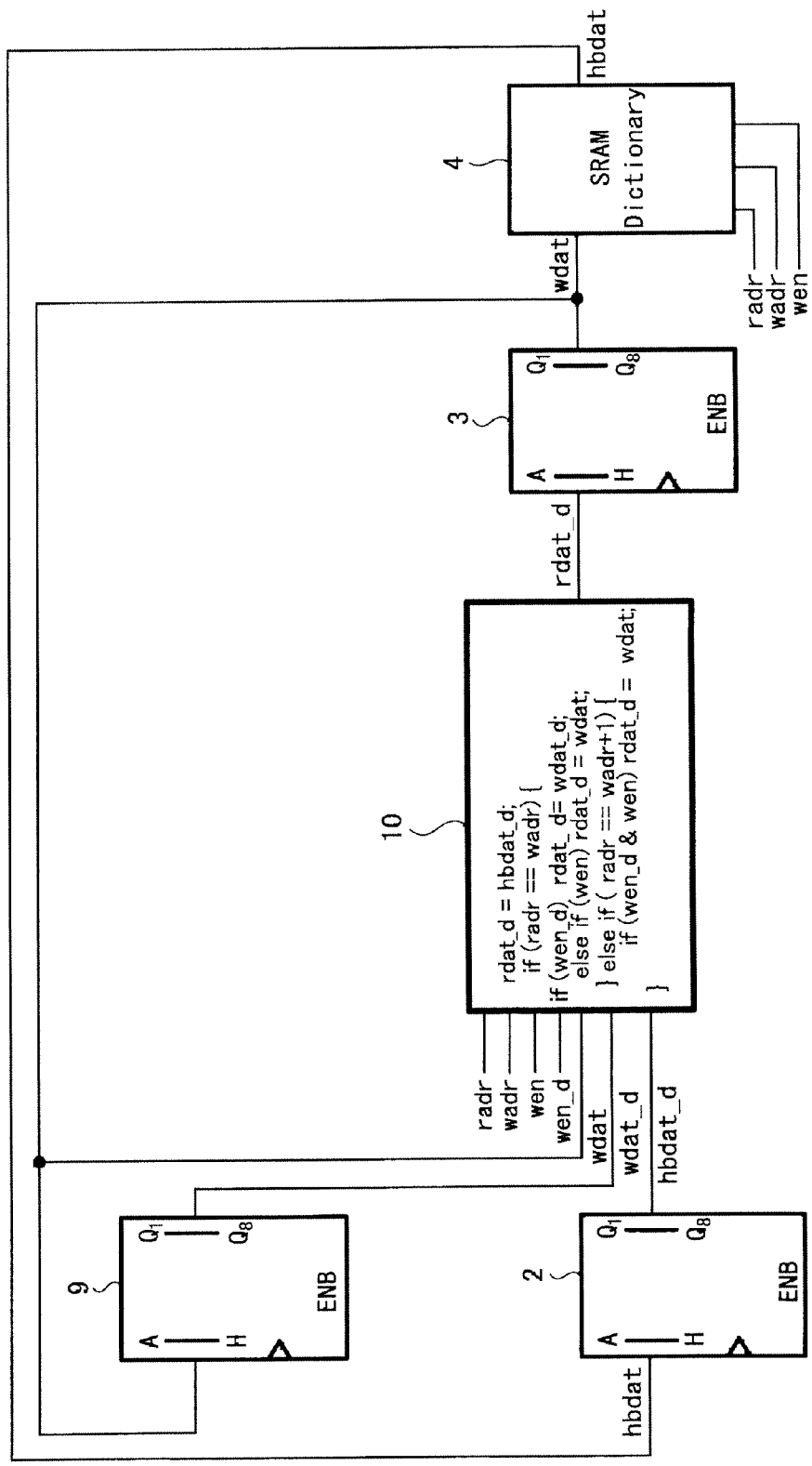
FIG. 11 is a block diagram showing an arrangement of a decoder circuit according to the present invention and which shows a combinational logic circuit 10 shown in FIG. 12 by using a hardware description language.

Therefore, as in the decoder circuit shown in FIG. 7, a decoder circuit according to the present invention has an arrangement using an algorithm in which data read out from the dictionary is substituted with data from a D flip-flop circuit and also it has an arrangement in which pipeline processing can be optimized. FIG. 11 is a block diagram showing an arrangement of a decoder circuit according to the present invention. In the decoder circuit shown in FIG. 11, the 8-bit registers 2 and 3 and the SRAM 4 are identical to those shown in FIG. 7 and therefore need not be described.

As shown in FIG. 11, this decoder circuit is not provided with the combinational logic circuit 1 shown in FIG. 7 but instead this decoder circuit includes a combinational logic circuit 10 provided between the 8-bit registers 2 and 3.

As shown in FIG. 11, the data hbdat read out from the dictionary is supplied to the 8-bit register 2. Data hbdat_d, which results from delaying the data hbdat one clock period, is outputted from the 8-bit register 2. This data hbdat_d is supplied to the combinational logic circuit 10.

The output wdat from the 8-bit register 3 is directly supplied to the combinational logic circuit 10, and an output wdat_d, which results from delaying the output wdat of the 8-bit register 3 one clock period, is supplied to the combinational logic circuit 10 from the 8-bit register 9.

Also, the read address radr, the write address wadr and write enable signals, which result from delaying the write enable signals next_wen and wen by a D flip-flop circuit (not shown) one clock period, are supplied to the combinational logic circuit 10.

The combinational logic circuit 10 is a circuit which selects and outputs any one of the data hbdat_d, wdat and wdat_d based on the contents of the read address rdar, the write address wdar and the write enable signals wen and wen_d as the data rdat_d read out from the dictionary.

Figure 12:
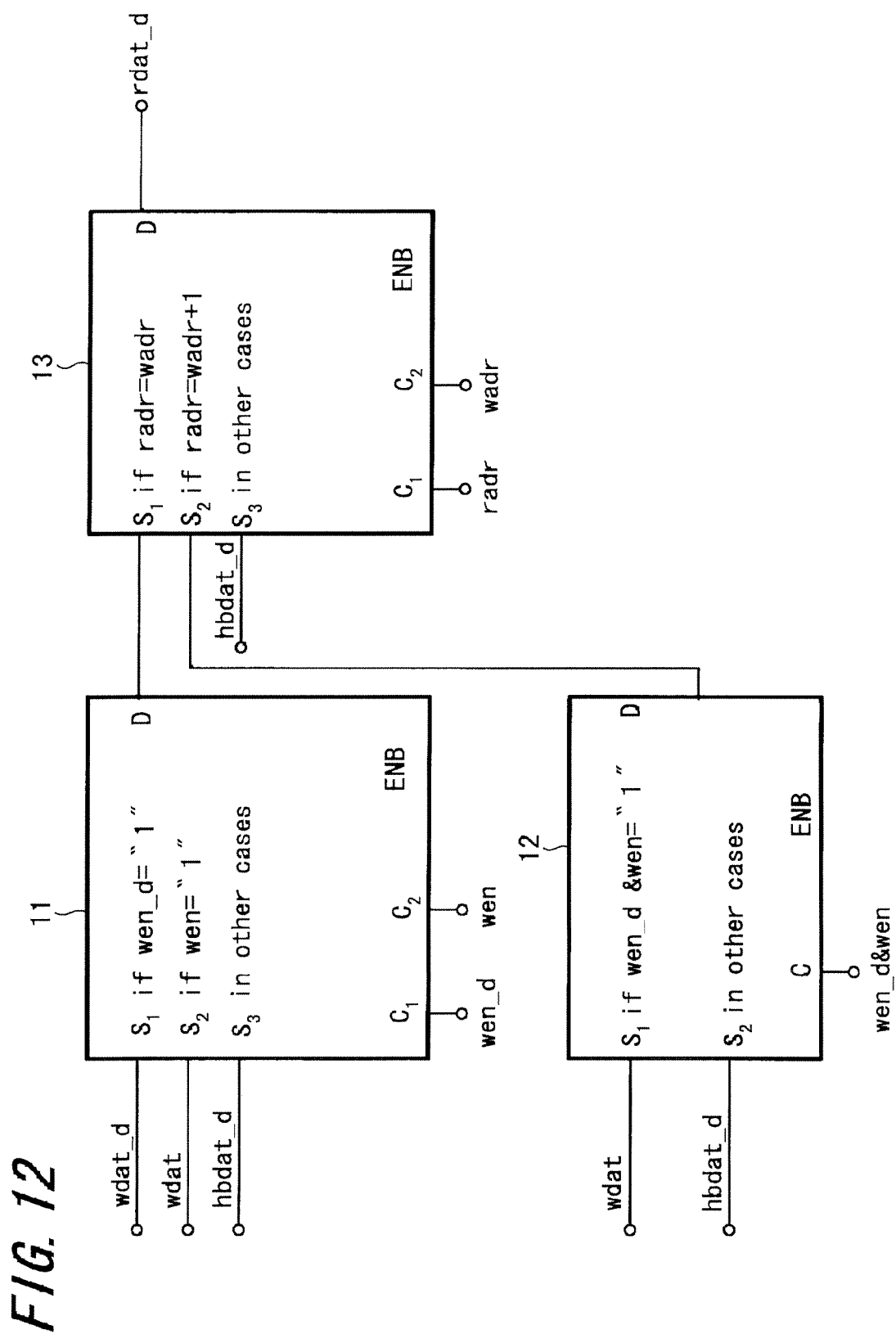
FIG. 12 is a block diagram showing a hardware arrangement of the combinational logic circuit 10 shown in FIG. 11.

FIG. 12 is a block diagram showing the arrangement of this combinational logic circuit 10 in the form of a hardware circuit. As shown in FIG. 12, the combinational logic circuit 10 includes a three-input and one-output multiplexer 11, a two-input and one-output multiplexer 12 and a three-input and one-output multiplexer 13.

The data wdat_d, wdat and hbdat_d are respectively supplied to the multiplexer 11, and the write enable signals wen_d and wen are respectively supplied to selection control terminals C1 and C2 of the multiplexer 11.

The multiplexer 11 selects the data wdat_d supplied to the input terminal S1 and outputs the selected data wdat_d from its output terminal D if the write enable signal wen_d is "1" (wen_d="1"). The multiplexer 11 selects the data wdat supplied to the input terminal S2 and outputs the selected output wdat from the output terminal D if the write enable signal wen_d is "0" (wen_d="0") but the write enable signal wen is "1" (wen="1"). In other cases, the multiplexer 11 selects the data hbdat_d supplied to the input terminal S3 and outputs the selected output hbdat_d from the output terminal D.

The data wdat and hbdat_d are respectively supplied to the input terminals S1 and S2 of the multiplexer 12. A signal indicative of a logical product of the write enable signals wen d and wen is supplied to a selection control terminal C of the multiplexer 12 from an AND circuit (not shown).

The multiplexer 12 selects the data wdat supplied to the input terminal S1 and outputs the selected output wdat from the output terminal D if the logical product of the write enable signal wen_d and the write enable signal wen is "1". In other cases, the multiplexer 12 selects the data hbdat_d supplied to the input terminal S2 and outputs the selected data hbdat_d from the output terminal D.

The output from the multiplexer 11, the output from the multiplexer 12 and the data hbdat_d are respectively supplied to the input terminals S1, S2 and S3 of the multiplexer 13, and the read address radr and the write address wadr are respectively supplied to the selection control terminals C1 and C2 of the multiplexer 13.

The multiplexer 13 selects the output supplied to the input terminal S1 from the multiplexer 11 and outputs the selected output from the output terminal D as the data rdat_d if the read address radr and the write address wadr are matched with each other. The multiplexer 13 selects the output supplied to the input terminal S2 from the multiplexer 12 and outputs the selected output from the output terminal D as the data rdat_d if the read address radr and a write address wadr+1 (that is, the next address of the write address wadr). In other cases, the multiplexer 13 selects the data hbdat_d supplied to the input terminal S3 and outputs the selected output from the output terminal D as the data rdat_d.

Within the block of the combinational logic circuit 10 shown in FIG. 11, logic required when this combinational logic circuit 10 is designed as the ASIC (application specific integrated circuit) or the programmable logic device (FPGA (filed programmable gate array), etc.) is described by a Verilog HDL which is a kind of hardware description languages.

As shown in FIG. 11, data rdat_d outputted from the combinational logic circuit 10 is supplied to the 8-bit register 3. The 8-bit register 3 outputs data wdat which results from delaying this data rdat_d one clock period (data written again in the dictionary during the current clock period). The data wdat is supplied to the SRAM 4 and it is also supplied to the combinational logic circuit 10 and the 8-bit register 9 as mentioned hereinbefore.

According to the decoder circuit shown in FIG. 11, in exactly the same manner as that has been described so far with reference to FIGS. 9 and 10, even when the data read out from the dictionary is delayed two clock periods and written again in the dictionary and the address near the write address wadr is designated as the read address radr (that is, even when the same address of the write address wadr or the next address of the write address wadr is designated as the read address radr), it is possible to accurately restore the dictionary.

Then, since data read out from the dictionary is delayed one clock period by the 8-bit register 2 and supplied to the combinational logic circuit 10, even when the SRAM 4 is operated at a low speed, the 8-bit register 2 is able to obtain a timing margin. As a result, data can be supplied to the combinational logic circuit 10 at a high speed and hence data rdat_d can be outputted from the combinational logic circuit 10 at a high speed. Consequently, it is possible to realize faster decoding processing based on pipeline processing.

In the above-mentioned embodiments, the example in which the data read out from the dictionary is substituted with the data from the D flip-flop circuit even when the character read out from the dictionary is delayed two clock periods and written again in the dictionary and the address near the write address is designated as the read address has been described so far. However, the present invention is not limited thereto and the following variants are also possible. That is, even when the character read out from the dictionary is delayed more than three clock periods and written again in the dictionary and the address near the write address is designated as the read address, data read out from the dictionary may be substituted with data from the D flip-flop circuit.

In the above-mentioned embodiments, the example in which the present invention is applied to the decoder circuit for decoding data compressed based on the LZ77 method has been described so far. However, the present invention is not limited thereto and can be applied to faster decoding processing in all sorts of decoder circuits in which data is read out from a dictionary stored in a memory at every predetermined unit data and the thus read unit data is written again in other address of the dictionary, whereafter data can be decoded by reading the next unit data out from the dictionary.

According to the present invention, in the decoder circuit in which data is read out from a dictionary stored in a memory at every predetermined unit data and the thus read unit data is written again in other address of the dictionary, whereafter data can be decoded by reading the next unit data, even when the address near the write address is designated as the read address, while the dictionary can be restored accurately, it is possible to realize faster decoding processing based on pipeline processing.

It should be understood by those skilled in the art that various modifications, combinations, sub-combinations and alterations may occur depending on design requirements and other factors insofar as they are within the scope of the appended claims or the equivalents thereof.

What is claimed is:

1. A decoder circuit in which predetermined unit data is read out from a dictionary stored in a memory, said read unit data is written again in a different address of said dictionary and said next unit data is read out from said dictionary to thereby decode data, comprising:

first delay means for delaying said unit data read out from said dictionary;

selecting means for selecting data; and second delay means for delaying data selected by said selecting means, wherein delayed data from said second delay means is written again in said dictionary, said selecting means is supplied with delayed data from said first delay means and delayed data from said second delay means, said selecting means selects delayed data from said second delay means if a write address and a read address of said dictionary fall within a range of a distance corresponding to delay amounts of said first and second delay means and said selecting means selects delayed data from said first delay means in other cases.

2. A decoder circuit according to claim 1, wherein said first and second delay means delay data one period of an operation clock, said selecting means selects delayed data from said second delay means if said write address and said read address are the same address or the next address of said write address and said read address are the same address and said selecting means selects delayed data from said first delay means in other cases.

3. A decoder circuit according to claim 2, wherein said delayed data from said second delay means is supplied to said selecting means as it is, said delayed data is further delayed one period of said operation clock by third delay means and supplied to said selecting means, said selecting means selects delayed data directly supplied from said second delay means if a write enable signal to permit data to be written in the current write address is supplied thereto when said write address and said read address are the same address, said selecting means selects delayed data from said third delay means if a write enable signal to permit data to be written in the next address of the current write address is supplied thereto and said selecting means selects delayed data directly supplied from said second delay means if a write enable signal to permit data to be written in both of the current write address and the next address is supplied thereto when the next address of said write address and said read address are the same address.

4. A decoding method in which predetermined unit data is read out from a dictionary stored in a memory, said read unit data is written again in a different address of said dictionary and said next unit data is read out from said dictionary to thereby decode data, comprising the steps of:

a first step for delaying said unit data read out from said dictionary;

a second step for selecting data; and a third step for delaying data selected by said second step and writing delayed data again in said dictionary, wherein said second step is supplied with delayed data from said first step and delayed data from said third step and selects delayed data from said third step if a write address and a read address of said dictionary fall within a range of a distance corresponding to delay amounts of said first and third steps and said second step selects delayed data from said first step in other cases.

5. A decoder circuit in which predetermined unit data is read out from a dictionary stored in a memory, said read unit data is written again in a different address of said dictionary and said next unit data is read out from said dictionary to thereby decode data, comprising:
- a first delay circuit for delaying said unit data read out from said dictionary;
- a selector for selecting data; and
- a second delay circuit for delaying data selected by said selector, wherein delayed data from said second delay circuit is written again in said dictionary, said selector is supplied with delayed data from said first delay circuit and delayed data from said second delay circuit, said selector selects delayed data from said second delay circuit if a write address and a read address of said dictionary fall within a range of a distance corresponding to delay amounts of said first and second delay circuit and said selector selects delayed data from said first delay circuit in other cases.

* * * * *